United States Patent [19]

Huntley

[11] 4,142,162
[45] Feb. 27, 1979

[54] LOW-DISTORTION DOUBLE SIDEBAND SUPPRESSED CARRIER MONOLITHIC MODULATOR

[75] Inventor: Christopher R. Huntley, Burnaby, Canada

[73] Assignee: GTE Automatic Electric Laboratories, Inc., Northlake, Ill.

[21] Appl. No.: 866,583

[22] Filed: Jan. 3, 1978

[51] Int. Cl.² ........................................... H03C 1/54
[52] U.S. Cl. ................................ 332/31 T; 325/138; 332/37 D; 332/44
[58] Field of Search ............... 332/31 T, 37 R, 37 D, 332/43 B, 44; 325/49, 138, 182

[56] References Cited

U.S. PATENT DOCUMENTS 3,550,040  12/1970  Sinusas .................................. 332/44

*Primary Examiner*—Siegfried H. Grimm
*Attorney, Agent, or Firm*—Leonard R. Cool

[57] ABSTRACT

A double sideband suppressed carrier (DSBSC) modulator for operation from unbalanced carrier frequency and modulation frequency sources has the input terminals of first and second constant current amplifiers connected to receive the modulation frequency output signal from the unbalanced source. The first and second constant current amplifiers provide in-phase and out-of-phase modulation frequency signals at respective high impedance output terminals for connection to a modulator. The modulator comprises a quad, i.e., four transistors connected to provide a pair of differential amplifiers. Transistors 1 and 2 comprising the first of the pair and transistors 3 and 4 comprising the second of the differential pair. The emitters of each differential amplifier are tied together. The emitter junction of the first differential amplifier is connected to the high impedance output of the first constant current amplifier, and the emitter junction of the second differential amplifier is connected to the high impedance output of the second constant current amplifier. The base of transistors 2 and 3 are connected together and then connected to one terminal of the carrier frequency source. The bases of transistors 1 and 4 are connected together and then connected to the other terminal of the carrier frequency source. The collectors of transistors 1 and 3 are tied together and the collectors of transistors 2 and 4 are tied together to provide the modulated signal output paths.

3 Claims, 1 Drawing Figure

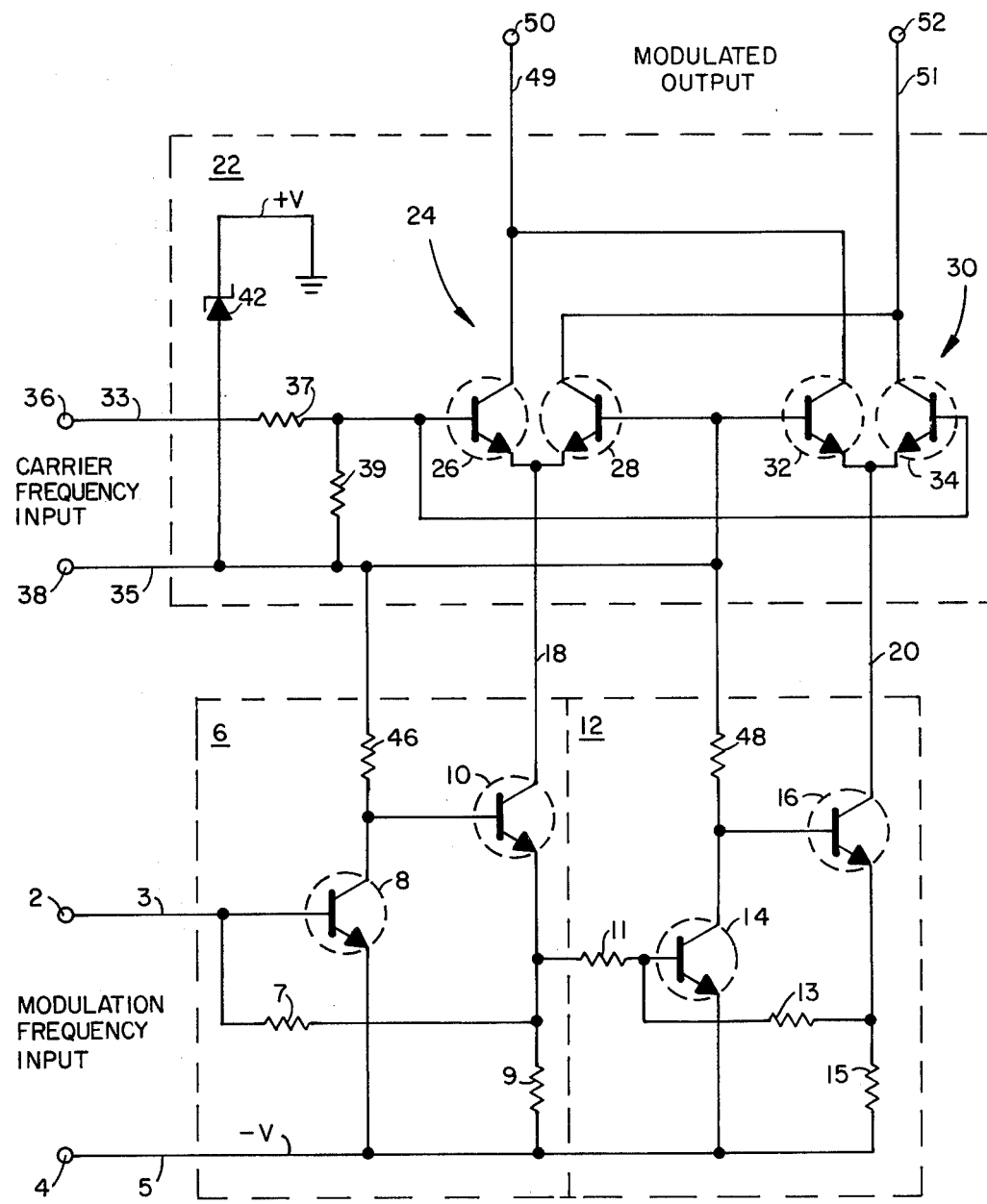

LOW-DISTORTION DOUBLE SIDEBAND SUPPRESSED CARRIER MONOLITHIC MODULATOR

BACKGROUND OF THE INVENTION

1. Field of the Invention

This invention relates to modulators particularly adapted to the modulation and demodulation of signals employed in carrier telephone systems, and more particularly to modulators (and demodulators) which provide a double sideband suppressed carrier output from unbalanced carrier and modulation frequency sources.

2. Description of the Prior Art

Typical of the prior-art modulators, which may be employed to obtain a DSBSC output signal, are those which are called ring modulators. In the early ring modulator circuits, rectifying devices, such as crystal diodes, were connected together in a bridge or a lattice arrangement and were positioned in the transmission path. Carrier suppression depended upon the careful matching of the diodes. This was expensive and not too satisfactory because the variations of the diode characteristics with temperature were not uniform as among the discrete elements. In addition, such an arrangement caused a transmission loss. Further, balanced transformers were required at the input and output of these modulators which added to their expense. Among other disadvantages of the ring type modulators, the problem of loss in the modulator was overcome by the invention described in U.S. Pat. No. 3,027,522, entitled Double Balanced Transistor Modulator, Boxall et al, Mar. 27, 1962. With reference to the circuit arrangements disclosed in the subject patent, it is important to note that transistors were used to replace the diode bridge, but that transformers were still necessary to provide the desired balance for suppression of the carrier, and, therefore, to obtain one of the required results.

More recently, a transistor modulator was disclosed which did not require the use of expensive bandpass suppression filters or balanced active and/or inactive devices. This modulator is disclosed in U.S. Pat. No. 3,719,903, entitled Double Sideband Modem With Either Suppressed Or Transmitted Carrier, Goodson, Mar. 6, 1973. This circuit employs a shunt switch modulator and it is well known that such a shunt switch modulation arrangement will not provide adequate suppression at high frequencies, such as, for example, 8 MHz, because the recombination time in the transistor does not allow the transistor to be shut off rapidly enough. Further, the level of transmitted carrier in the output signal depends upon the presence or absence of a DC bias in the modulator, as is taught by the invention.

Another modulator is the balanced modulator-demodulator circuit shown in FIGS. 5 and 6, page 7-392, of the "Linear Integrated Circuits Data Book", Motorola, Inc., 1972. This circuit does not provide adequate adjustment in the modulation frequency input so that the gain is independent of the amplitude of the modulation frequency signal. Thus, linearity suffers and the carrier suppression as well as the suppression of miscellaneous modulation products is not adequate for circuits which are to be employed in telecommunication systems.

SUMMARY OF THE INVENTION

A double sideband suppressed carrier modulator has first and second high output impedance devices connected to receive the modulation frequency output signal from an unbalanced source and to provide in-phase and out-of-phase modulation frequency signals at the high impedance output terminals thereof. The impedance of the first and second devices is sufficiently high so that the amplitude of the modulation signals applied to the modulator is substantially independent of the carrier frequency voltage.

A modulator comprising a pair of differential amplifiers, i.e., a quad differential amplifier, accepts the in-phase and out-of-phase signals from the high impedance devices and a carrier frequency from an unbalanced source and provides a double sideband suppressed carrier signal at output terminals thereof. The outputs of the differential amplifiers are connected so that the modulated output signals add to increase the amplitude of the modulated signal at the modulator output.

BRIEF DESCRIPTION OF THE DRAWING

The single FIGURE of the drawing is a schematic representation of the modulator-demodulator of the invention.

DETAILED DESCRIPTION OF THE PREFERRED EMBODIMENT

Referring to the single FIGURE of the drawing, terminals 2 and 4 suitably receive an input signal for modulation or demodulation - hereinafter a modulation frequency. A first constant current amplifier 6 comprises input transistor 8, output transistor 10, feedback resistor 7, and emitter resistor 9. The base of input transistor 8 is connected via path 3 to terminal 2, and the emitter of transistor 8 is connected via path 5 to terminal 4. The collector of transistor 8 is connected to one end of bias resistor 46 and to the base of transistor 10, thereby providing an inverted and amplified input signal to transistor 10. The signal is again amplified and inverted in transistor 10 between the base and collector so that an in-phase modulation signal is available on path 18.

A second constant current amplifier 12 comprises input transistor 14, output transistor 16, base input resistor 11, feedback resistor 13 and emitter resistor 15. One end of input resistor 11 is connected to the emitter of transistor 10, thereby providing an inverted input signal to the base of transistor 14. The amplified signal at the collector of transistor 14 is applied to the base of transistor 16. Resistor 48 connects the collector of transistor 14 to the bias potential. The amplified modulation frequency which appears on the collector lead of transistor 16 is again inverted, and, thus, applies an out-of-phase modulation signal on path 20 to modulator 22.

In order to minimize the carrier leak, as will become clear later, it is important that the quiescent DC current on path 18 be substantially equal to that on path 20. Thus, in the preferred embodiment of the invention, emitter resistors 9 and 15 are selected to be substantially equal, and the input resistor 11 and feedback resistor 13 are selected so that the output of transistor 16 is the same as the output of transistor 10. This requires that the relationship between feedback resistor 7 of amplifier 6 is in the proper proportion to the input resistor 11 and feedback resistor 13 of amplifier 12. Further, the base-emitter voltages of transistors 8 and 14 should be matched as they also directly determine the quiescent currents. Such matching is best obtained by the use of monolithic integrated circuit technology.

Modulator 22 is a quad differential amplifier which is composed of a first differential amplifier 24 comprising transistors 26 and 28; and a second differential amplifier 30 comprising transistors 32 and 34. Terminals 36 and 38 are suitably connected to receive an input carrier frequency for modulation purposes. Zener diode 42 establishes a constant potential source for transistors 10, 16, 28 and 32, via resistor 39 to transistors 26 and 34, and via resistors 46 and 48, respectively, to transistors 8 and 14. An L-pad consisting of resistors 37 and 39 is connected between paths 33 and 35 with the junction of resistors 37 and 39 being connected to the bases of transistors 26 and 34, and the other end of resistor 39 being connected to the bases of transistors 28 and 32. Resistors 37 and 39 are selected so as to derive the proper operational carrier frequency voltage to be applied to the differential amplifiers 24 and 30. The effect of the carrier is to switch one transistor of each differential pair on at a time, alternately, as the carrier frequency shifts in polarity. The emitters of transistors 26 and 28 are connected together and to path 18 from amplifier 6. The emitters of transistors 32 and 34 are connected together and to path 20 from amplifier 12. The collector of transistor 26 is connected to path 49 and terminal 50 to provide one terminal of the modulator output, and the collector of transistor 34 is connected along path 51 to terminal 52 to provide the other output terminal of the modulator. The collector of transistor 28 is connected to path 51 and the collector of transistor 32 is connected to path 49.

First, assume there is no modulating frequency applied to terminals 2 and 4. The output on path 51 will be the quiescent DC current on path 18 for one-half of the carrier frequency cycle and the quiescent DC current on path 20 for the other half of the carrier frequency cycle, plus an AC component at the carrier frequency which is equal to the mismatch between the quiescent currents on paths 18 and 20. This results in carrier leak at the output of the modulator. Therefore, it is important that these quiescent currents are well matched. For this reason, the current on path 20 should come from a circuit having the same characteristics as the circuit from which the current on path 18 is obtained. The addition of gain in the circuit improves the overall performance because of the greater dynamic range. Thus, the signal current output of transistor 16, which is controlled by resistors 11, 13 and 15, is set to provide the same signal current amplitude as that obtained from transistor 10.

Under normal modulation conditions the output of the modulator 22 is derived as follows:

During one portion of the cycle, when the carrier frequency applies the appropriate bias to the bases of transistors 26 and 34 so that they are conducting, it may be seen that the in-phase modulation signal from amplifier 6 will pass via path 18, emitter of transistor 26 to collector of transistor 26, and path 49 to terminal 50. At the same time, the out-of-phase component of the modulation signal will pass from amplifier 12 via path 20, emitter-collector of transistor 34 via path 51 to terminal 52. Thus, the signals will add in-phase to provide the modulated output signal.

While the invention has been particularly shown and described with reference to a preferred embodiment thereof, it will be understood by those skilled in the art that change in form and detail may be made therein without departing from the spirit and scope of the invention.

What is claimed is:

1. A low-distortion double sideband suppressed carrier modulator, arranged to operate from the unbalanced output terminals of a carrier frequency source and from the unbalanced output terminals of a modulation frequency source, comprising:
   a quad amplifier comprising:
   a first differential amplifier including first and second transistors having their emitters connected together and to a first input terminal, having the base of said first transistor arranged for connection to a first output terminal of said carrier frequency source, having the base of said second transistor arranged for connection to a second output terminal of said carrier frequency source, having the collector of said first transistor connected to a first output terminal and the collector of said second transistor connected to a second output terminal; and
   a second differential amplifier including third and fourth transistors having their emitters connected together and to a second input terminal, having the base of said third transistor connected to the base of said second transistor, having the base of said fourth transistor connected to the base of said first transistor, having the collector of said third transistor connected to said first output terminal and the collector of said fourth transistor connected to said second output terminal, whereby the modulated output signals from said first and second differential amplifiers are combined so as to increase the amplitude of the modulated signal at the modulator output terminals;
   a first high impedance circuit comprising:
   a fifth transistor having a base electrode connected to a third input terminal, and having an emitter electrode connected to a fourth input terminal, said third and fourth input terminals arranged for connection to a modulation frequency source; and
   a sixth transistor having a base electrode connected to the collector electrode of said fifth transistor, having a collector electrode connected to the first input terminal, having a first feedback resistor connected between the emitter electrode of said sixth transistor and the base electrode of said fifth transistor, and a second feedback resistor connected between the emitter electrode of said sixth transistor and said fourth input terminal; and
   a second high impedance circuit comprising:
   a seventh transistor having the emitter electrode connected to the fourth input terminal, and having impedance means connected between the emitter electrode of said sixth transistor and the base electrode of said seventh transistor for providing an inverted modulation frequency input to said seventh transistor; and
   an eighth transistor having the base electrode connected to the collector electrode of the seventh transistor, having the emitter electrode connected through a third feedback resistor connected to said fourth input terminal, having a fourth feedback resistor connected between the emitter electrode of the eighth transistor and the base of the seventh transistor and having the collector electrode connected to the second input terminal of the quad amplifier.

2. Apparatus in accordance with claim 1 wherein said second feedback resistor and said third feedback resistor are matched.

3. Apparatus in accordance with claim 2 wherein said impedance means and said third and fourth feedback resistors are selected to provide substantially the same modulation signal output on the collector electrode of said eighth transistor as is obtained from the collector electrode of said sixth transistor.

* * * * *